United States Patent [19]
Ryu et al.

[11] Patent Number: 6,026,047
[45] Date of Patent: Feb. 15, 2000

[54] INTEGRATED CIRCUIT MEMORY DEVICE WITH HIERARCHICAL WORK LINE STRUCTURE

[75] Inventors: Hoon Ryu, Suwon; Jun-Young Jeon, Seoul, both of Rep. of Korea

[73] Assignee: SamSung Electronics Co., Ltd., Suwon, Rep. of Korea

[21] Appl. No.: 09/185,090

[22] Filed: Nov. 3, 1998

[51] Int. Cl.$^7$ .................................................. G11C 8/00
[52] U.S. Cl. .................. 365/230.06; 365/185.23
[58] Field of Search ........................ 365/230.06, 185.23

[56] References Cited

U.S. PATENT DOCUMENTS

| | | | |
|---|---|---|---|
| 5,652,731 | 7/1997 | Saeki | 365/203.06 |
| 5,761,135 | 6/1998 | Lee | 365/230.06 |
| 5,818,790 | 10/1998 | Kim et al. | 365/230.06 |
| 5,862,098 | 1/1999 | Jeong | 365/230.06 |
| 5,875,149 | 2/1999 | Oh et al. | 365/230.06 |

*Primary Examiner*—David Nelms
*Assistant Examiner*—Vanthu Nguyen
*Attorney, Agent, or Firm*—Jones Volentine, LLP

[57] ABSTRACT

A dynamic random access memory device includes sub-word line drivers to drive sub-word lines up to a boosted voltage level. Each sub-word line driver generates a sub-word drive signal to drive a corresponding sub-word line in response to main-word decode signal and a sub-word decode signal. Each of the sub-word line drivers includes an N-channel MOS pull-up transistor and an N-channel MOS precharge transistor whose threshold voltages are different from each other. The conduction path of the pull-up transistor is coupled between the sub-word decode signal and the corresponding sub-word line. The precharge transistor has a conduction path coupled between the main-word line and the control electrode of the pull-up transistor. The control electrode of the precharge transistor is coupled to the boosted voltage. The boosted voltage is larger than the power supply voltage by twice the threshold voltage of the pull-up transistor. The threshold voltage of the precharge transistor is smaller than that of the pull-up transistor.

8 Claims, 5 Drawing Sheets

INTEGRATED CIRCUIT MEMORY DEVICE WITH HIERARCHICAL WORK LINE STRUCTURE

BACKGROUND OF THE INVENTION

1. Field of the Invention

The present invention relates to integrated circuit memory devices, and more particularly, to an integrated circuit memory device having a hierarchical word line structure including main-word and sub-word lines.

2. Description of the Related Art

A hierarchical word line configuration having main-word lines and sub-word lines has been necessarily adopted for dynamic random access memory (DRAM) device having a large capacity of 256 Mb or above. Since the main-word lines and the sub-word lines are separately driven, the power dissipation can be reduced. Also the pitch of the main-word lines does not need to be strict, which is helpful in the manufacture of large scale devices. Such a word structure is disclosed, for example, in U.S. Pat. Nos. 5,416,748; 5,596,542; 5,764,585; and 5,781,498, all of which are hereby incorporated herein by reference as if fully set forth herein.

In DRAM devices, power supply voltages such as positive voltage Vcc and reference ground voltage Vss are required to be constant regardless of variations in the temperature and noise interference. Within a memory device the voltage Vcc is typically generated by an internal supply voltage generator. The supply voltage is referred to as internal Vcc (IVC). IVC has a unique DC level, for example, IVC is 5 V, 3.3 V, 2.8 V, or 2 V.

Some circuit elements in DRAM devices require a boosted voltage $V_{BST}$ greater than the IVC level. For instance, a word line driver must supply a boosted voltage to gates on storage cell transistors (see U.S. Pat. No. 5,673,225). The boosted voltage must be greater than the IVC by twice the threshold voltage of the cell transistor.

Referring to FIG. 1, a conventional DRAM device with hierarchical word line structure is shown. The DRAM device has a typical 'quarter pitch' layout in which 4 sub-word lines and 4 bit lines make the unit pitch of the cell array. A main-word line MWL corresponds to four sub-word lines SWL1–SWL4 which are coupled to an array of memory cells 10. A main-word line (MWL) decoder 20 uses an on-chip boosted power supply voltage $V_{BST}$ and generates a main-word decode signal MD in response to a portion A3–An of a row address. The main-word decode signal MD swings between the ground voltage Vss and the boosted voltage $V_{BST}$. A sub-word line (SVL) predecoder 30 is responsive to the other portion A1 and A2 of the row address and generates four sub-word predecode signals PX1–PX4. When in the stand-by state, all of the sub-word predecode signals PX1–PX4 remain at the Vss level (i.e., logic low level), but during the active stage only one of which stays at the $V_{BST}$ level (i.e., logic high level).

Four SWL decoders 40-1 through 40-4 correspond to the sub-word predecode signals PX1–PX4 respectively and are supplied with both the IVC and $V_{BST}$. Each of the SWL decoder 40-1 through 40-4 generates two sub-word decode signals WDi and WDiB (where i=1, 2, 3, or 4) in response to a corresponding one of the sub-word predecode signals PX1–PX4. During the stand-by state, all of the sub-decode signals WD1, WD2, WD3 and WD4 remain at the Vss level, but in the active state one of the sub-decode signals WD1, WD2, WD3 and WD4 transitions to the $V_{BST}$ level. All of the sub-decode signals WD1B, WD2B, WD3B and WD4B remain at the IVC level in the stand-by state while in the active state at the Vss level.

Four SWL drivers 50-1 through 50-4 correspond to the sub-word lines 40-1 through 40-4 (or the SWL decoders SWL1–SVL4), respectively. Each SWL driver 50-i consists of three N-channel MOS transistors Mi1, Mi2, and Mi3 (where i=1, 2, 3, or 4). Each SWL driver 50-i generates a sub-word drive signal SDi in response to the main-word decode signal MD and its corresponding sub-word decode signals WDi and WDiB and provides the sub-word drive signal SDi onto its corresponding sub-word line SWLi. As is well known, the sub-word lines are generally boosted above Vcc+$V_T$ (where $V_T$ is the threshold voltage of a MOS transistor) to increase noise margin and overcome the threshold drop of the cell access transistor.

In the active state, the main-word line MWL is driven to the $V_{BST}$ level by the MWL decoder 20 so that the node Ni within each SWL driver 50-i rises to the $V_{BST}$–$V_T$ level (where $V_T$ is the threshold voltage of each transistor therein). Thereafter, when the sub-decode signals WDi and WDiB of a selected SWL decoder 40-i go to the $V_{BST}$ and Vss levels, respectively, depending upon the row addresses A1 and A2, the node Ni begins to be boosted due to the gate-to-drain capacitance of the pull-up transistor Mi1 so that the transistor Mi2 is shut off and provides isolation between the main-word line MWL and the node Ni. Such a self-boosting effect enables the corresponding sub-word line SWLi to be driven to the fully high voltage level of the sub-decode signal WDi (i.e., the $V_{BST}$ level). The pull-down transistor Mi3 acts as a current sinker to discharge the corresponding sub-word line SWLi while the main-word line MWL and the sub-decode signal WDiB remain at the Vss and IVC levels, respectively.

Gate oxide is an important element of the MOS transistors. This thin dielectric layer can break down, resulting in gate shorts, during a long or strong application of electric field across the oxide. Oxide breakdown is generally believed to be caused by positive charge buildup.

As discussed above, in the conventional DRAMs with the hierarchical word line arrangement, since the main-word line decoder 20 and the sub-word line drivers 50-1 through 50-4 are supplied with the boosted voltage $V_{BST}$ or above, there may be a high probability that the MOS transistors therein will have poor gate oxide reliability.

To solve the above problem, a MWL decoder and SWL drivers using the internal power supply voltage IVC has been proposed as shown in FIG. 2. Referring to FIG. 2, the conventional DRAM device has the same arrangement as that shown in FIG. 1 with the exception that the MWL decoder 20a and the SWL drivers 50a-1 through 50a-4 are provided with the internal power supply voltage IVC instead of $V_{BST}$ as in the embodiment of FIG. 1. In FIG. 2, the same parts as those shown in FIG. 1 are represented with like reference numerals and to avoid description duplication, accordingly, their explanation will be omitted.

The structure of FIG. 2 may help to provide an improved gate oxide reliability, but another problem may be encountered when it is adopted for a memory device which utilizes a low power voltage supply, for example, 2 volts or below. This problem will be explained below.

Referring again to FIG. 2, in the active state, the main-word line MWL is driven to the IVC level by the MWL decoder 20a so the node Ni within each SWL driver 50a-i rises to the IVC–$V_T$. Thereafter, when the sub-decode signals WDi and WDiB of a selected SWL decoder 40-i go to the $V_{BST}$ and Vss levels respectively, the node Ni is finally boosted up to a level of $IVC-V_T+V_{BST}=2IVC+V_T$ as a result of the self-boosting effect.

For example, if it were assumed that the IVC and the $V_T$ are 3 volts and 0.6 volts respectively, the node Ni would be boosted up to the voltage of 6.6 (=2×3+0.6) volts so that the pull-up transistor Mil can fully drive the corresponding sub-word line SWLi up to the $V_{BST}$ level of 4.2 (=3+2×0.6) volts.

However, if the IVC is assumed to be 2 volts, then the node Ni will be boosted up to the voltage of 4.6 volts. This voltage may not be enough to drive the corresponding sub-word line SWLi up to the fall $V_{BST}$ level of 3.2 volts, causing the increased precharge time delay and the reduced noise margin. In addition, the lower the power supply voltage, the more serious such a negative effect. Consequently, the word line driving architecture of FIG. 2 may have a limitation in low voltage operation.

SUMMARY OF THE INVENTION

The present invention is intended to solve the above problems, and accordingly it is an object of the invention to provide a low voltage DRAM device with hierarchical word line architecture, which is capable of boosting its word lines enough to read/restore a full power supply voltage level from/into its memory cell.

In order to attain the above object, the present invention provides a dynamic random access memory integrated circuit device which includes a main-word line decoder, a sub-word line predecoder, a plurality of sub-word line decoders, and a plurality of sub-word line drivers. The main-word line decoder is responsive to a first portion of a row address and generates a main-word decode signal to drive a main-word line. The main-word line is driven up to a boosted voltage ($V_{BST}$) greater than a power supply voltage (Vcc or IVC) by the main-word decoder. The sub-word line predecoder is responsive to a second portion of the row address and selectively generates a plurality of sub-word predecode signals. Each sub-word line decoder is responsive to a corresponding one of the sub-word predecode signals and generates a sub-word decode signal. This sub-word decode signal goes to the boosted voltage ($V_{BST}$) when activated. Each sub-word line driver is responsive to the main-word decode signal and the sub-word decode signal and generates a sub-word drive signal to drive a corresponding sub-word line. Each of the sub-word line drivers includes an N-channel MOS pull-up transistor and an N-channel MOS precharge transistor whose threshold voltages are different from each other. The pull-up transistor's conduction path is coupled between the sub-word decode signal and the corresponding sub-word line. The precharge transistor has a conduction path coupled between the main-word line and the control electrode of the pull-up transistor. The control electrode of the precharge transistor is coupled to the boosted voltage ($V_{BST}$). The boosted voltage is larger than the power supply voltage by twice the threshold voltage of the pull-up transistor. The threshold voltage of the precharge transistor is smaller than that of the pull-up transistor.

BRIEF DESCRIPTION OF THE DRAWINGS

In describing the preferred embodiment of the present invention, reference is made to accompanying drawings wherein.

DETAILED DESCRIPTION OF THE PREFERRED EMBODIMENT

A preferred embodiment of the present invention will now be described with reference to the accompanying drawings in detail, in which well-known circuits are shown in block diagram form in order not to obscure the present invention.

Figure 1:
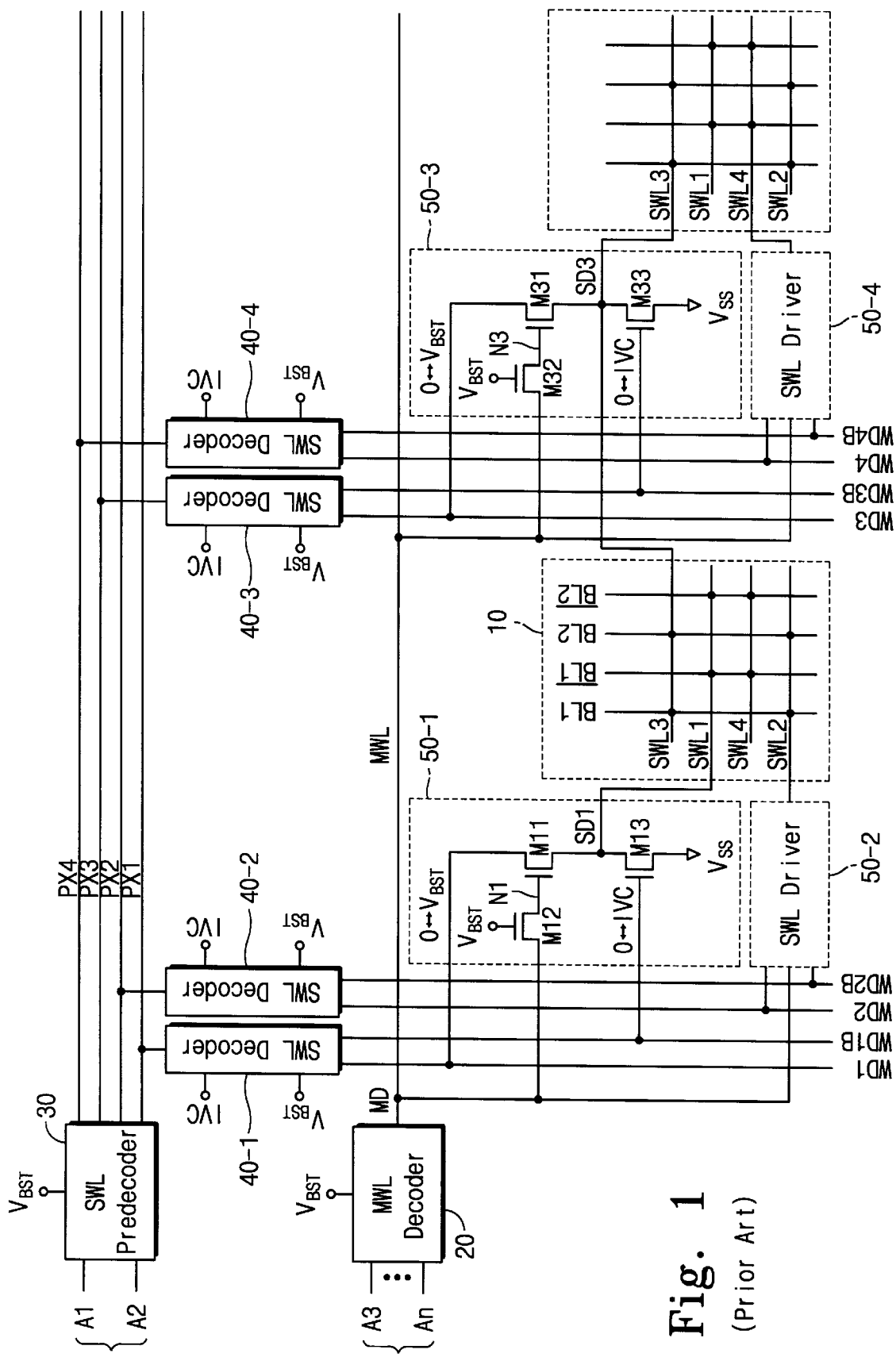
FIG. 1 is a circuit diagram illustrating a prior art DRAM device.
Figure 2:
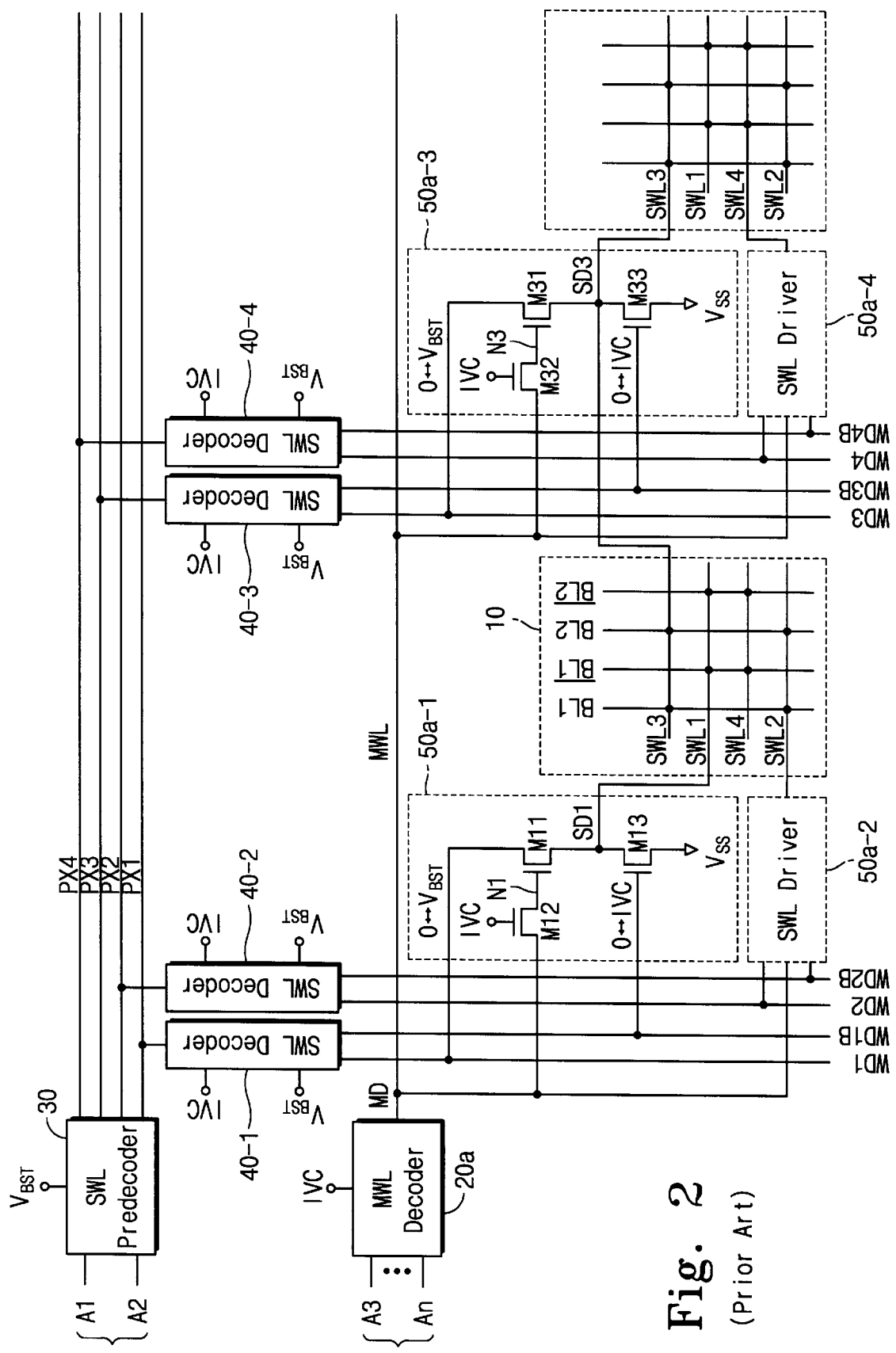
FIG. 2 is a circuit diagram illustrating another prior art DRAM device.
Figure 3:
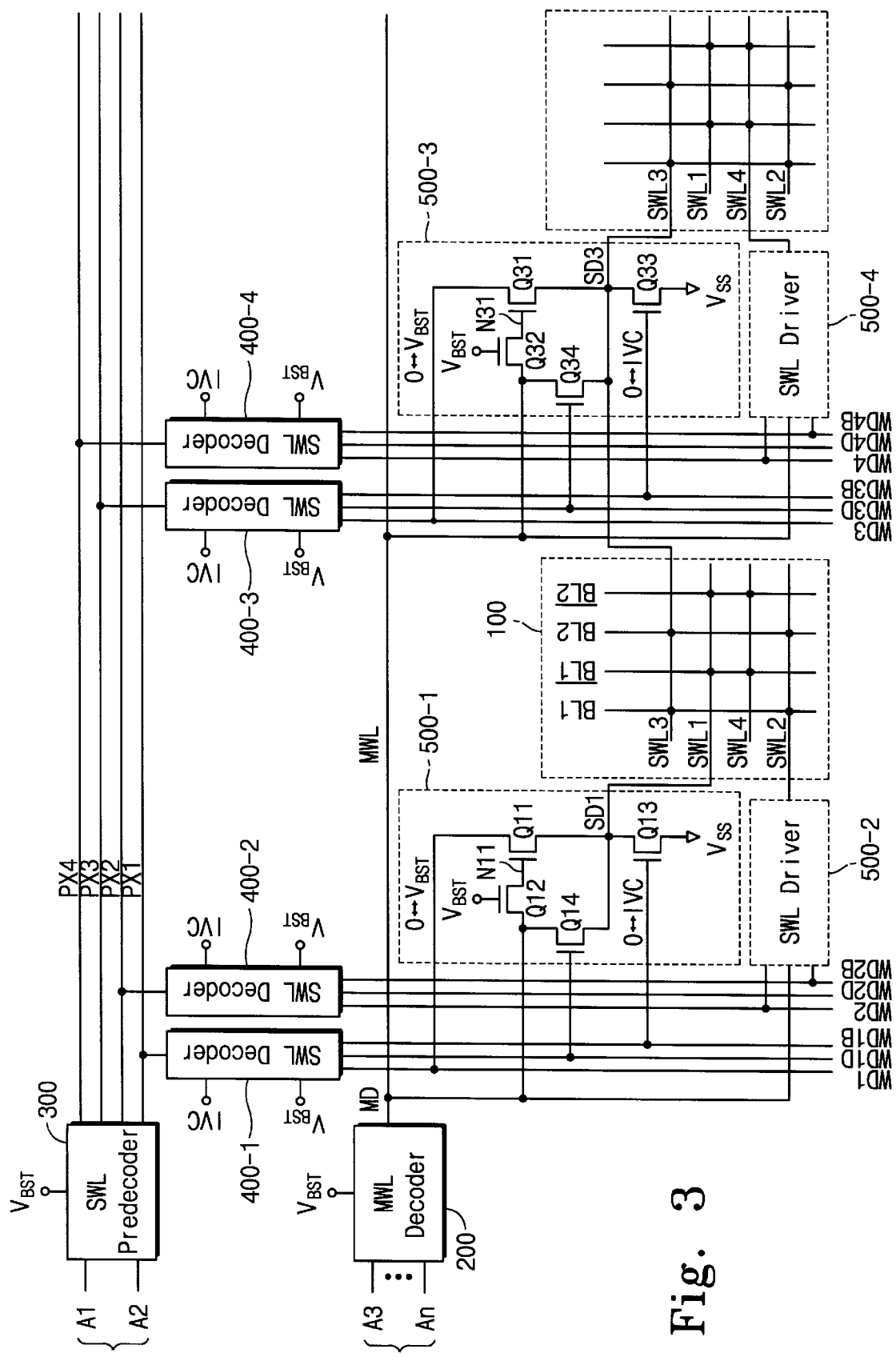
FIG. 3 is a circuit diagram illustrating an embodiment of the DRAM device according to the present invention.

Referring to FIG. 3, a preferred embodiment of the DRAM device according to the present invention is illustrated. The DRAM device has a hierarchical word structure including main-word lines and sub-word lines, and it has a typical 'quarter pitch' layout in which 4 sub-word lines and 4 bit lines make the unit pitch of the cell array. A main-word line MWL corresponds to four sub-word lines SWL1–SWL4 which are coupled to an array of memory cells 100. A MWL decoder 200 uses an on-chip boosted power supply voltage $V_{BST}$ and generates a main-word decode signal MD in response to a portion A3–An of a row address. The main-word decode signal MD swings between the ground voltage Vss and the boosted voltage $V_{BST}$. A SWL predecoder 300 is responsive to the other portion A1 and A2 of the row address and generates four sub-word predecode signals PX1–PX4. When in the stand-by state, all of the sub-word predecode signals PX1–PX4 remain at the Vss level (i.e., logic low level), but during the active stage only one of which is pulled up to the $V_{BST}$ level (i.e., logic high level).

Four SWL decoders 400-1 through 400-4 correspond to the sub-word predecode signals PX1–PX4 respectively and are supplied with both the IVC and $V_{BST}$. Each of the SWL decoder 400-1 through 400-4 generates three sub-word decode signals WDi, WDiB and WDiB (where i=1, 2, 3, or 4) in response to a corresponding one of the sub-word predecode signals PX1–PX4.

Figure 4:
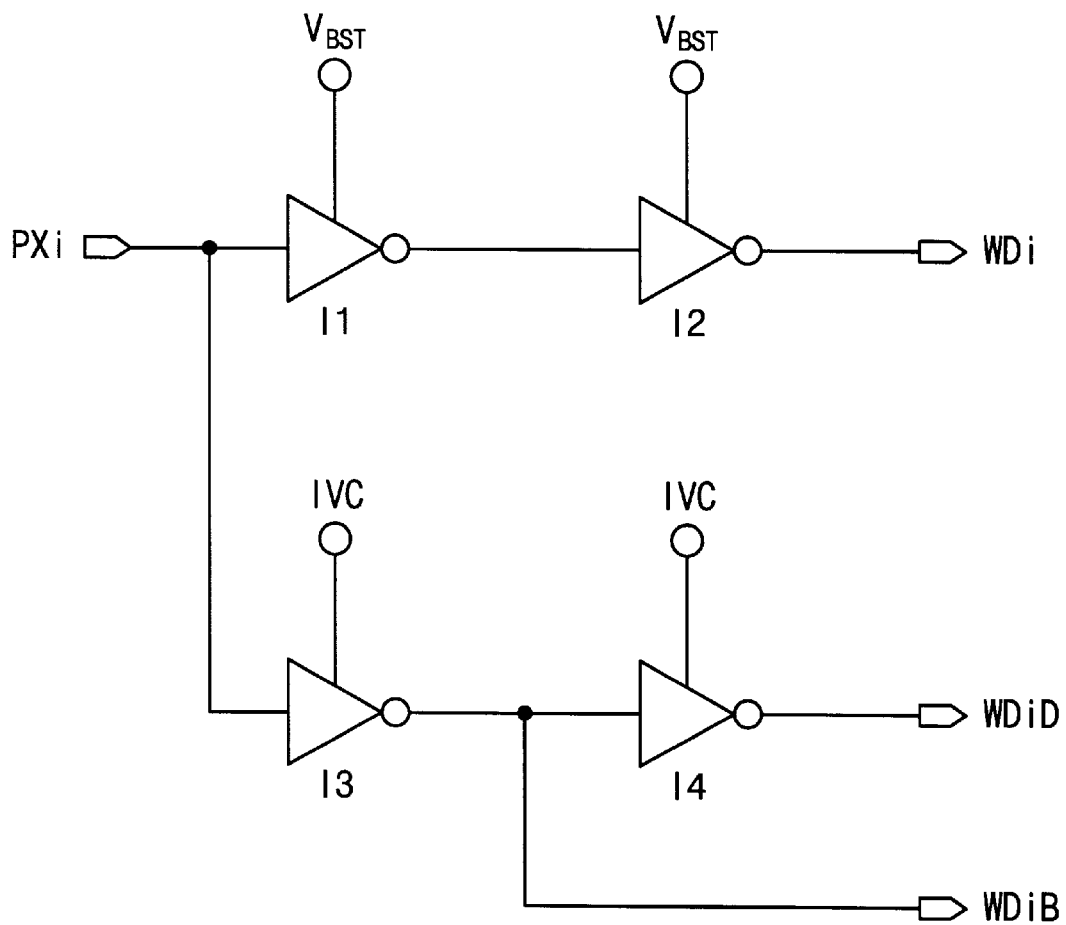
FIG. 4 is a detailed circuit diagram of the respective SWL decoders of FIG. 3.

The detailed circuit configuration of the respective SWL decoders 400-1, 400-2, 400-3, and 400-4 is shown in FIG. 4. Each SWL decoder 400-i consists of two inverters I1 and I2 which are coupled in series and another two serially coupled inverters I3 and I4. The two inverters I1 and I2 are supplied with the boosted voltage $V_{BST}$ while the other two inverters I3 and I4 are supplied with the power supply voltage IVC. The inverters I1 and I3 are applied with a corresponding sub-word predecode signal PXi. Sub-word decode signal WDi is fed out of the inverter I2. The other sub-word decode signals WDiB and WDiD are output from the inverters I3 and I4, respectively. The sub-word decode signal WDi swings between the low power supply voltage Vss and the boosted voltage $V_{BST}$, but both the sub-word decode signals WDiD and WDiB swing between the Vss (lower power supply voltage) and the IVC (upper power voltage).

During the stand-by state, all of the sub-decode signals WDi, WDiD, and WDiB remain at the Vss, Vss, and IVC levels, respectively. When in the active state, only the sub-decode signals WDi, WDiD, and WDiB of a selected one of the SWL decoders 400-1 through 400-4 become the $V_{BST}$, IVC, and Vss levels, respectively.

Returning to FIG. 3, four SWL drivers 500-1 through 500-4 correspond to the sub-word lines 400-1 through 400-4 (or the SWL decoders SWL1–SWL4), respectively. Each SWL driver 500-i consists of four N-channel MOS transistors Mi1, Mi2, Mi3 and Mi4 (where i=1, 2, 3, or 4). Each SWL driver 500-i generates a sub-word drive signal SDi in response to the main-word decode signal MD and its corresponding sub-word decode signals WDi, WDiD and WDiB. The sub-word drive signal SDi is provided to the corresponding sub-word line SWLi.

Each sub-word line driver 500-i includes four N-channel MOS transistors Qi1 through Qi4 (i=1, 2, 3, or 4). The first transistor Qi1 has its source-drain channel coupled between the sub-word decode signal WDi and the corresponding sub-word line SWLi. The second transistor Qi2 has its source-drain channel coupled between the mainword line MWL and the gate of the first transistor Qi1. The gate of the second transistor Qi2 is coupled to the $V_{BST}$. Herein, the boosted voltage $V_{BST}$ is preferably larger than the IVC by twice the threshold voltage of the first transistor. The source-drain channel of the third transistor Qi3 is coupled between the corresponding sub-word line SWLi and the Vss, and the gate thereof is coupled to the sub-word decode signal WDiB. The fourth transistor Qi4 has its source-drain channel coupled between the main-word line MWL and the corresponding sub-word line SWLi, and its gate is coupled to the sub-word decode signal WDiD. The third and fourth transistors Qi3 and Qi4 is provided for discharging the sub-word line SWLi.

In particular, it is to reduce the precharge time of the node Ni1 that the threshold voltage of the second transistor Qi2 is preferably made smaller than that of the other transistors Qi1, Qi3, and Qi4.

In the active state, the main-word line MWL is driven to the $V_{BST}$ level by the MWL decoder 200 so that the node Ni within each SWL driver 500-i rises to the VBST $V_{BST}-V_{TQi2}$ (where $V_{TQi2}$ is the threshold voltage of the precharge transistor Qi2). Thereafter, when the sub-decode signals WDi and WDiD of a selected SWL decoder 40-i go to the $V_{BST}$ and IVC levels, respectively, depending upon the row addresses A1 and A2, the node Ni1 begins to be boosted due to the gate-to-drain capacitance of the pull-up transistor Qi1 so that the transistor Qi2 is shut off and provides isolation between the main-word line MWL and the node Ni1. At this time, although the IVC is applied to the gate of the switching transistor Qi4, the transistor Qi4 remains at off state since the main-and sub-word lines are boosted to the $V_{BST}$ level higher than the IVC level.

Due to the self-boosting effect, the node Ni1 is finally boosted up to a level: $V_{BST}-V_{TQi2}+V_{BST}$. Since $V_{TQi2}<V_T$, where $V_T$ denotes the threshold voltage of a typical NMOS transistor such as Qi1, Qi3 and Qi4, $V_{BST}-V_{TQi2}+V_{BST}>V_{BST}-V_T+V_{BST}=2\ V_{BST}-V_T=2(IVC+2\ V_T)-V_T=2\ IVC+3\ V_T$.

For example, if the IVC and $V_T$ are assumed to be 2 volts and 0.6 volts respectively, then the node Ni1 will be boosted up to about the voltage of 5.8 volts. As a result, the corresponding sub-word line SWLi can be driven to the fully high voltage level of the sub-decode signal WDi (i.e., the $V_{BST}$ level of 3.2 V). Therefore, although the IVC is 2 volts or less, the corresponding sub-word line SWLi can be driven up to the fall $V_{BST}$ level, allowing the precharge time delay and the noise margin to be reduced.

Figure 5:
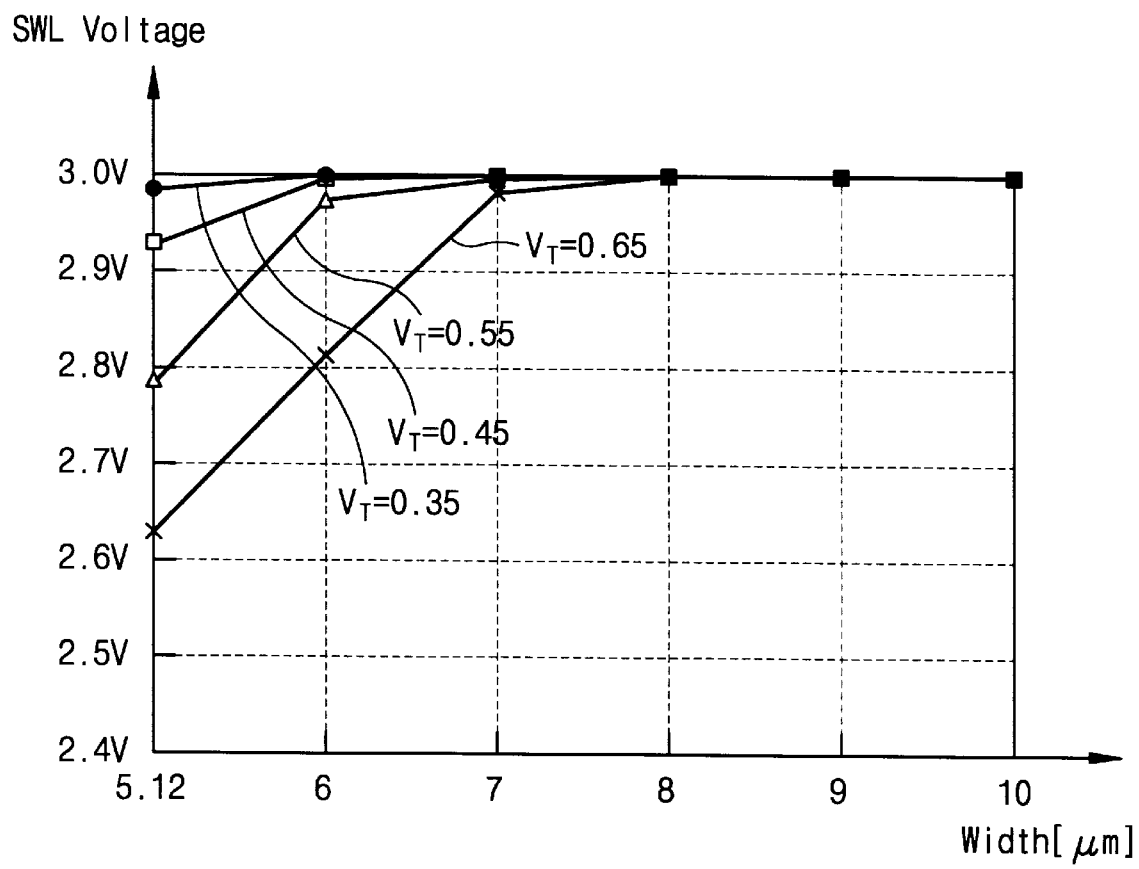
FIG. 5 is a graph depicting the sub-word line boosting voltage level versus the precharge transistor channel width for the different values of the precharge transistor threshold voltage.

FIG. 5 is a graph depicting the relationship between the sub-word line boosting voltage level versus the channel width of the precharge transistor Qi2 with respect to the different values of the threshold voltage $V_T$ of the precharge transistor Qi2.

While the invention has been described in its preferred embodiment, it is to be understood that the words which have been used are words of description rather than limitation and that changes within the purview of the appended claims may be made without departing from the true scope of the invention as defined by the claims.

What is claimed is:

1. An integrated circuit memory device comprising:

an array of memory cells;

a main-word line;

a plurality of sub-word lines which are coupled to said memory cells;

a main-word line decoder which is responsive to a first portion of a row address and generates a main-word decode signal to drive said main-word line;

a sub-word line predecoder which is responsive to a second portion of the row address and selectively generates a plurality of sub-word predecode signals;

a plurality of sub-word line decoders each of which is responsive to a corresponding one of the sub-word predecode signals and each of which generates one of a plurality of sub-word decode signals; and a plurality of sub-word line drivers each of which is responsive to the main-word decode signal and one of the sub-word decode signals and generates a sub-word drive signal to drive a corresponding one of said sub-word lines, said sub-word line drivers each comprising, a first MOS transistor having a first threshold voltage, and having a control electrode and a conduction path coupled between said sub-word decode signal and said corresponding sub-word line, and a second MOS transistor having a second threshold voltage and having a conduction path coupled between said main-word line and said control electrode of said first MOS transistor, and having a control electrode coupled to a boosted voltage larger than a power supply voltage, wherein the second threshold voltage is less than the first threshold voltage.

2. The intergrated circuit memory device according to claim 1, wherein said boosted voltage is larger than said power supply voltage by twice the first threshold voltage.

3. The intergrated circuit memory device according to claim 1, wherein said first and second MOS transistors are N-channel types.

4. The intergrated circuit memory device according to claim 3, wherein said main-word line is driven up to the boosted voltage in response to the main-word decode signal being activated.

5. The intergrated circuit memory device according to claim 4, wherein said sub-word decode signal goes to the boosted voltage when said sub-word decode signal is activated.

6. An integrated circuit memory device comprising:

an array of memory cells;

a main-word line;

a plurality of sub-word lines which are coupled to said memory cells;

a main-word line decoder which is responsive to a first portion of a row address and generates a main-word decode signal to drive said main-word line up to a boosted voltage higher than an upper power supply voltage;

a sub-word line predecoder which is responsive to a second portion of the row address and generates a plurality of sub-word predecode signals;

a plurality of sub-word line decoders each of which is responsive to a corresponding one of the sub-word predecode signals and each of which generates first through third sub-word decode signals; and a plurality of sub-word line drivers each of which is responsive to the main-word decode signal and the first through third sub-word decode signals generated by one of the plurality of sub-word line decoders, and generates a sub-word drive signal to drive a corresponding one of said sub-word lines, said sub-word line drivers each comprising, a first N-channel MOS transistor having a source-drain channel coupled between said first sub-word decode signal and said corresponding sub-word line and having a gate, a second N-channel MOS transistor having a source-drain channel coupled between said main-word line and the gate of said first N-channel MOS transistor, and a gate coupled to said boosted voltage, a third N-channel MOS transistor having a source-drain channel coupled between said corresponding sub-word line and a lower power supply voltage and a gate coupled to said third sub-word decode signal, and a fourth N-channel MOS transistor having a source-drain channel coupled between said main-word line and said corresponding sub-word line and a gate coupled to said second sub-word decode signal, wherein a threshold voltage of said second N-channel MOS transistor is smaller than a threshold voltage of said first N-channel MOS transistor.

7. The intergrated circuit memory device according to claim 6, wherein said boosted voltage is larger than said upper power supply voltage by twice the first threshold voltage of said first N-channel MOS transistor.

8. The intergrated circuit memory device according to claim 6, wherein said main-word decode signal and said first sub-word decode signal saving between the lower power supply voltage and the boosted voltage, and said second and third sub-word decode signals swing between the lower power supply voltage and the upper power supply voltage.

* * * * *